(12) United States Patent
Rothenhaeusler et al.

(10) Patent No.: US 11,116,076 B2
(45) Date of Patent: Sep. 7, 2021

(54) FLEXIBLE CONDUCTOR TRACK FOR CONNECTING ELECTRONIC MODULES, PARTICULARLY MODULES OF A CAMERA TO BE INSTALLED IN A VEHICLE

(71) Applicant: Conti Temic microelectronic GmbH, Nuremberg (DE)

(72) Inventors: Konrad Rothenhaeusler, Achberg (DE); Franz Pfeiffer, Einsingen (DE); Thilo Berg, Neu Ulm (DE); Jos Becher, Beimerstetten (DE); Andreas Schleinkofer, Regensburg (DE); Martin Vallendor, Ravensburg (DE); Matthias Dropmann, Friedrichshafen (DE); Oscar Torres Alsina, Ingolstadt (DE); Steffen Goermer, Winterrieden (DE); Patrick Albrecht, Ingolstadt (DE); Hendrik Powileit, Bodolz (DE); Dieter Kroekel, Eriskirch (DE)

(73) Assignee: Conti Temic microelectronic GmbH, Nuremberg (DE)

(*) Notice: Subject to any disclaimer, the term of this patent is extended or adjusted under 35 U.S.C. 154(b) by 2 days.

(21) Appl. No.: 16/478,991

(22) PCT Filed: Dec. 5, 2017

(86) PCT No.: PCT/DE2017/200126
§ 371 (c)(1),
(2) Date: Jul. 18, 2019

(87) PCT Pub. No.: WO2018/133893
PCT Pub. Date: Jul. 26, 2018

(65) Prior Publication Data
US 2019/0357352 A1 Nov. 21, 2019

(30) Foreign Application Priority Data
Jan. 19, 2017 (DE) .................... 10 2017 200 817.2

(51) Int. Cl.
*H05K 1/00* (2006.01)
*H05K 1/02* (2006.01)
*H05K 1/03* (2006.01)

(52) U.S. Cl.
CPC ......... *H05K 1/0281* (2013.01); *H05K 1/0393* (2013.01); *H05K 2201/10121* (2013.01); *H05K 2201/2009* (2013.01)

(58) Field of Classification Search
CPC .............. H05K 1/0281; H05K 1/0393; H05K 2201/10121; H05K 2201/2009;
(Continued)

(56) References Cited

U.S. PATENT DOCUMENTS 5,752,851 A * 5/1998 Zaderej ................. H01R 12/62
439/493
7,166,907 B2 * 1/2007 Onishi ............. H01L 27/14618
257/434
(Continued)

FOREIGN PATENT DOCUMENTS

JP 2008-130602 A 6/2008
WO WO 2017/003531 1/2017

OTHER PUBLICATIONS

English translation of the International Search Report of the International Searching Authority for International Application PCT/DE2017/200126, dated Apr. 3, 2018, 2 pages, European Patent Office, HV Rijswijk, Netherlands.
(Continued)

*Primary Examiner* — Yuriy Semenenko
(74) *Attorney, Agent, or Firm* — W. F. Fasse

(57) ABSTRACT

A flexible conductor track (10) for connecting electronic modules, includes conductor track structures (12), two connecting regions (14, 16) for electrically connecting the conductor track structures (12) to corresponding conductor
(Continued)

tracks of electronic modules, and at least one long slit (18, 20) in a region (11) in the conductor track (10) located between the two connecting regions. At least one of the connecting regions is designed to be connected to a corresponding connecting region of an electronic module by anisotropic conductive film adhesive (ACFA) bonding.

17 Claims, 7 Drawing Sheets

(58) Field of Classification Search
CPC ......... H05K 3/361; H05K 2201/09063; H05K 2201/09236; H05K 1/147
See application file for complete search history.

(56) References Cited

U.S. PATENT DOCUMENTS

| | | | | |
|---|---|---|---|---|
| 2004/0089955 | A1* | 5/2004 | Zhou | G06K 9/0002 257/787 |
| 2008/0276819 | A1* | 11/2008 | Desai | F42B 3/13 102/202.7 |
| 2008/0289859 | A1* | 11/2008 | Mikado | H05K 1/0281 174/254 |
| 2009/0257626 | A1 | 10/2009 | Sherlock et al. | |
| 2013/0032381 | A1* | 2/2013 | Hiyama | H05K 1/028 174/254 |
| 2014/0127916 | A1 | 5/2014 | Lee | |
| 2014/0354900 | A1* | 12/2014 | Qian | H05K 1/028 349/12 |
| 2019/0357352 | A1* | 11/2019 | Rothenhaeusler | H05K 1/0281 |

OTHER PUBLICATIONS

PCT International Preliminary Report on Patentability including English Translation of PCT Written Opinion of the International Searching Authority for International Application PCT/DE2017/200126, dated Jul. 23, 2019, 7 pages, International Bureau of WIPO, Geneva, Switzerland.

German Search Report for German Patent Application No. 10 2017 200 817.2, dated Jan. 24, 2018, 9 pages, German Patent and Trademark Office, Muenchen, Germany, with partial English translation, 7 pages.

\* cited by examiner

FLEXIBLE CONDUCTOR TRACK FOR CONNECTING ELECTRONIC MODULES, PARTICULARLY MODULES OF A CAMERA TO BE INSTALLED IN A VEHICLE

FIELD OF THE INVENTION

The invention relates to a flexible conductor track for connecting electronic modules, particularly modules of a camera to be installed in a vehicle such as, for example, a driver assistance system camera, and an optical module for a camera, which is particularly designed to be installed in a vehicle according to the independent claims.

BACKGROUND INFORMATION

Cameras are increasingly being installed in vehicles, especially for driver assistance systems or respectively ADAS (Advanced Driver Assistance Systems). Such cameras are deployed, for example, in order to capture the environment of a vehicle, in order to realize driver assistance functions such as lane recognition, object detection, determination of distances and similar camera-based functions. Cameras are also deployed in order to supplement radar systems deployed in vehicles such as, for example, a proximity radar and also for so-called surround view and top view systems, which make possible a 360° panoramic view of the vehicle. A further application for cameras in vehicles is sensing rain by recognizing rain drops on a vehicle windshield.

Cameras, particularly those which are intended to be deployed in driver assistance systems, typically consist of a housing, for example a two-part plastic housing, an optical module and a motherboard. As a general rule, the optical module includes the image sensor, a lens, a sturdy backplate, on which the image sensor can be mounted, and a flexible conductor track in order to electrically connect the image sensor to the motherboard. In particular, such flexible conductor tracks are frequently deployed with small electronic devices such as cameras for vehicles or smartphones for connecting electronic modules.

In the case of driver assistance systems having cameras, the interface between the image sensor and an electronic module is designated a CIF (Camera Interface) in order to distinguish it from other interfaces. A CIF interface must be particularly designed to transfer video data from the image sensor into a video data memory of an electronic module, typically in the form of a 16-bit parallel interface, and therefore has a correspondingly complex plug-in connection having a plurality of contacts within a small space. This makes it susceptible to metal particles, moisture condensation which can occur especially when it is installed behind a vehicle windscreen, and whisker formation which can lead to a weakening of the signaling or even to short-circuits.

SUMMARY OF THE INVENTION

An object of the present invention is to propose an improved electrical connection of electronic modules, particularly modules of a camera to be installed in a vehicle such as, for example, a driver assistance system camera.

This object can be achieved by a flexible conductor track and an optical module according to aspects of the invention set forth herein. Further configurations and embodiments of the invention are also disclosed.

The present invention initially proposes that ACFA (anisotropic conductive film adhesive) bonding be deployed as the connection technology instead of a CIF plug-in connection of a flexible conductor track and an electronic module. As a result, the technical outlay for the flexible conductor track connection can be reduced, and a manufacturing process for producing the connection can be simplified and optimized. Additionally, the robustness of the flexible conductor track connection, especially with respect to metal particles, moisture condensation and whisker formation, can be improved. In order to further increase the load-carrying capacity of a conductor track connection produced by means of ACFA bonding, the invention additionally proposes that long slits be introduced into the flexible conductor track connection, which can particularly comprise such a large distance from the connecting region of the conductor track connection that the connecting region can rest in as flat a manner as possible on the electronic module, so that as complete an ACFA bonding as possible of the connection regions can be achieved. A long slit can increase the load-carrying capacity of the conductor track connection according to the invention particularly with respect to bending forces which can typically act on the conductor track connection between the image sensor and the motherboard during a roll angle mounting of a camera. A flexible conductor track connection according to the invention is therefore particularly suitable for deployment in cameras which are deployed in vehicles such as, for example, driver assistance system cameras. ACFA can be applied e.g. as adhesive tape or liquid adhesive.

One embodiment of the invention relates to a flexible conductor track for connecting electronic modules, comprising conductor track structures, two connecting regions for electrically connecting the conductor track structures to corresponding conductor tracks of electronic modules, and at least one long slit in a region in the conductor track located between the two connecting regions, at least one of the connecting regions being designed to be connected to a corresponding connecting region of an electronic module by means of anisotropic conductive film adhesive bonding.

A long slit can particularly end at a predetermined distance before the connecting regions, in order to thus make it possible for the connecting regions to rest in as flat a manner as possible in each case on corresponding connecting regions of electronic modules.

The width of a long slit can decrease towards at least one of the connecting regions. As a result, the support surface of the connection produced by means of anisotropic conductive film adhesive bonding can be enlarged and, thus, the load-carrying capacity of the connection can be improved.

Distances between neighboring conductor track structures and/or the widths of conductor track structures can be smaller in the region of a long slit than in at least one of the connecting regions. The risk of whisker formation and short-circuits by metal particles can be further reduced by the enlarged distance of the conductor track structures in the connecting region. Wider conductor track structures in a connecting region can facilitate and improve the contacting with conductor track structures of a corresponding connecting region of an electronic module, and can particularly reduce a transition resistance in the contact region.

In order to obtain a structure which is as loadable as possible, the flexible conductor track can comprise a laminated construction of multiple layers made of plastics, adhesives and metals, particularly a first covering plastic layer, a first adhesive layer, a first copper layer, a middle plastic layer, a second copper layer, a second adhesive layer and a second covering plastic layer.

The flexible conductor track can also comprise an additional reinforcing layer which particularly counteracts bending forces acting on the flexible conductor track. Such a reinforcing layer can, for example, be formed by an additional metal layer, e.g. made of copper, which is not used for conductor tracks, but is configured in such a manner that the flexible conductor track can withstand deformations, particularly bending, and the forces occurring during a roll angle adjustment during deployment in a camera.

For example, the additional reinforcing layer can be designed in the form of a line grid, dot pattern or cross grid applied extensively to the flexible conductor track. These structures can make possible an additional protective function during bending of the conductor track as well as a holding force, in order to hold the deformation in the conductor track.

The additional reinforcing layer can be designed to cover the full surface in at least one of the connecting regions, as a result of which a configuration of a connecting region of a connection produced by means of anisotropic conductive film adhesive bonding, which is as sturdy and flat as possible, can be guaranteed. The reinforcing layer can additionally make it possible, for example, for the image sensor of a camera to be adhesively bonded directly to one of the connecting regions of the flexible conductor track by means of anisotropic conductive film adhesive bonding.

At least one of the connecting regions can additionally be designed to be wider than the region of the conductor track comprising the at least one long slit, particularly a connecting region which is provided for connecting by means of anisotropic conductive film adhesive bonding. Due to the larger connecting surface, the load-carrying capacity of the connection of said connecting region to a corresponding connecting region of an electronic module can particularly be increased.

The flexible conductor track can comprise one or more inspection windows for alignment purposes in at least one of the connecting regions. Such an inspection window can, for example, be utilized together with so-called vias in the motherboard in order to align a connecting region. To this end, backlighting and a light-sensitive sensor can be used for the alignment. The light of the backlighting enters through the inspection window and the vias and can be captured by the sensor which, as a function thereof, controls, for example, the alignment of the connecting region of the flexible conductor track or the motherboard such that a maximum light quantity is captured if vias and inspection windows are aligned exactly.

Furthermore, an embodiment of the invention relates to an optical module for a camera which is particularly designed to be installed in a vehicle, the optical module comprising an image sensor module, a lens and a flexible conductor track as described above, the image sensor module comprising an image sensor on a connecting region of the flexible conductor track, which is connected to conductor track structures by means of anisotropic conductive film adhesive bonding, and a backplate, on which the image sensor rests, and the lens being fastened to the connecting region of the flexible conductor track by means of adhesive in such a manner that it can produce optical imaging on the image sensor.

BRIEF DESCRIPTION OF THE DRAWINGS

Further advantages and possible applications of the present invention are set out by the following description in conjunction with the exemplary embodiment(s) represented in the drawing(s), wherein.

DETAILED DESCRIPTION OF EXAMPLE EMBODIMENTS OF THE INVENTION

Figure 1:
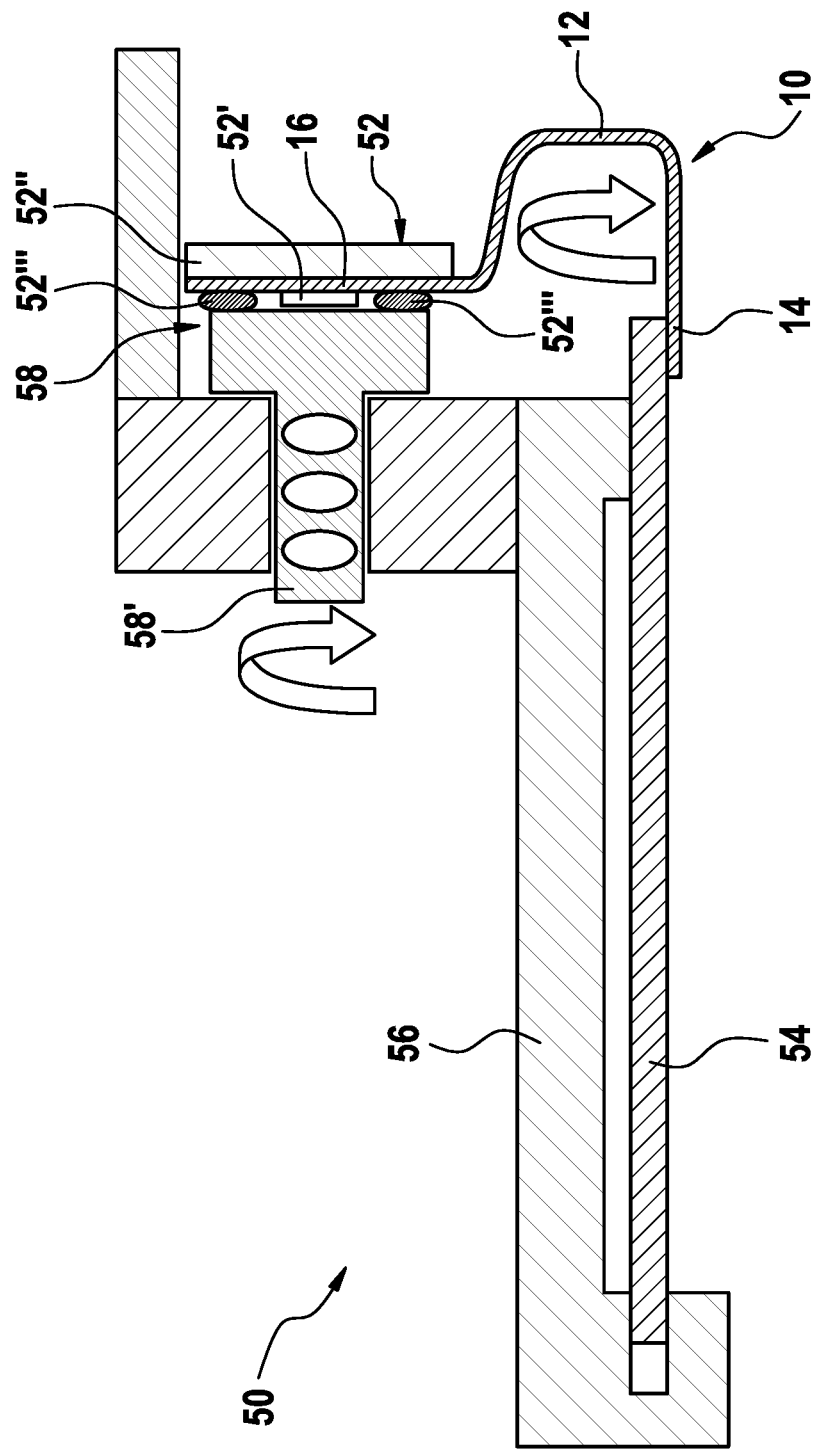
FIGS. 1 and 2 show an exemplary embodiment of a driver assistance system camera having an optical module according to the invention, which is connected by a flexible conductor track to the motherboard of the camera.

In the following description, the same, functionally similar and functionally related elements can be provided with the same reference numerals. Absolute values are only indicated below by way of example and are not to be understood to limit the invention.

Figure 2:
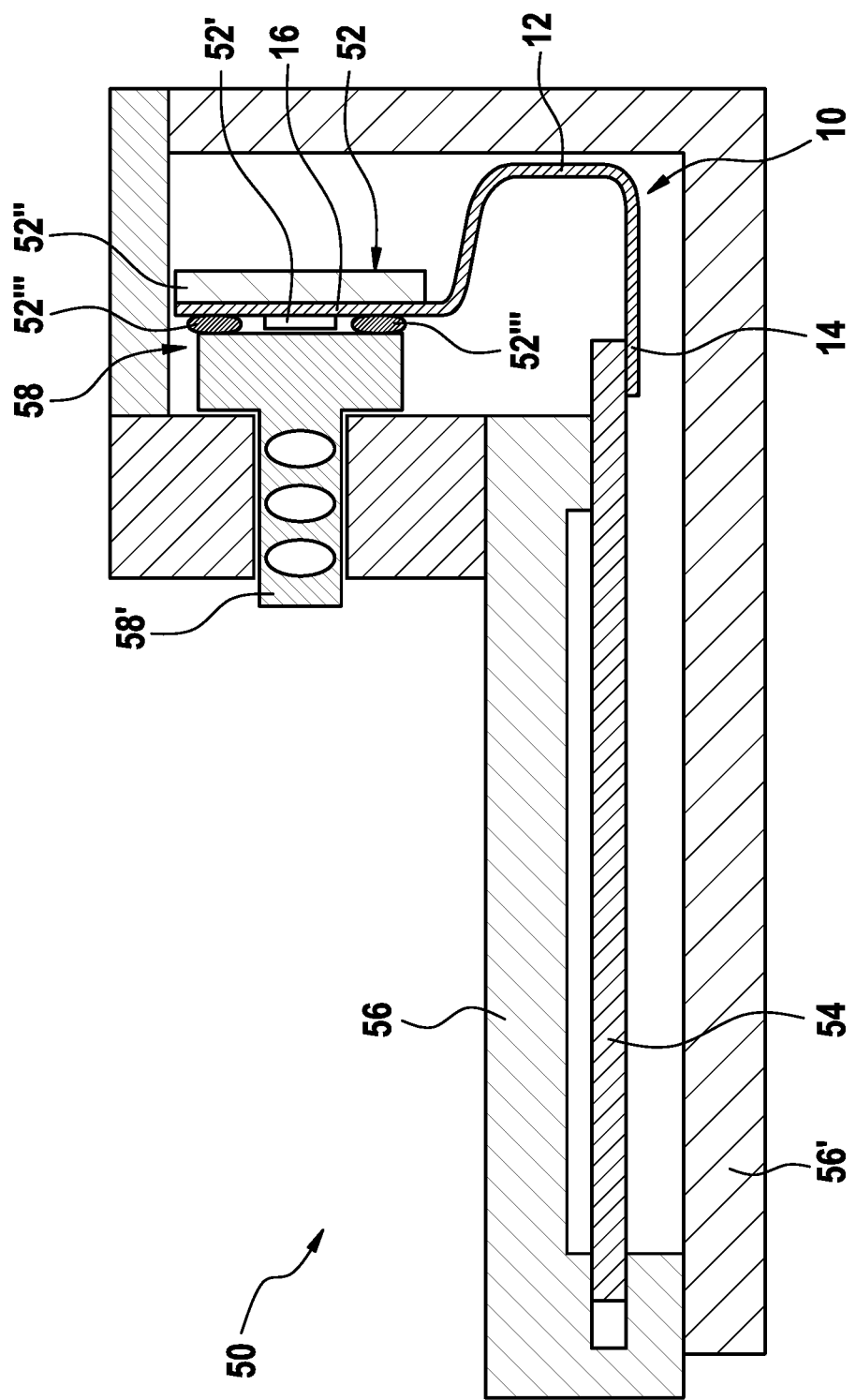

FIGS. 1 and 2 show a driver assistance system camera 50 for deployment in a vehicle, particularly for mounting behind a windscreen of the vehicle, for example integrated into the base of the central rearview mirror. The camera 50 includes an optical module 58 and a motherboard 54 which are arranged in a plastic or metal housing which is composed of two housing halves 56 and 56'. The motherboard 54 fixed in the housing half 56 is electrically connected to an image sensor module 52 of the optical module 58 by way of a flexible conductor track 10 according to the invention.

The image sensor module 52 comprises an image sensor 52', for example a CMOS image sensor, and a sturdy backplate 52" (stiffener) for holding the image sensor 52'. The image sensor 52' is electrically connected to the corresponding connecting region 16 of the flexible conductor track by means of ACFA bonding. The connecting region 16 having the image sensor 52' is fastened, for example adhesively bonded, onto the sturdy backplate 52". A lens 58' of the optical module 58 is fastened directly, i.e. without a separate lens holder, onto the image sensor module 52 which is formed in such a manner by means of an adhesive 52", such that the optical module 58 is designed as a unit which is firmly joined together. The other connecting region 14 of the flexible conductor track 10 is electrically connected to a corresponding connecting region of the motherboard 54 by means of ACFA bonding.

During ACFA bonding, an adhesive strip is applied to the motherboard 54 in the prebonding step. The housing 56 having the optical module 58 or only the optical module (in the case of the housing being subsequently joined) is positioned towards the motherboard 54 and is conductively connected with a hot punch in the regions of the contacting, while the regions without contacts continue to act as insulators because the conductive particles in the adhesive have not been sufficiently compressed in order to produce a conductive connection. The connection which is created in such a manner has advantages in terms of its robustness to metal particles following the bonding, and has very small transition resistances due to the large contact surfaces. In addition, a huge price advantage can be attained compared with a plug-in connection.

In order to complete the mounting of the camera 50, with the housing open, the optical module 58 is screwed into a corresponding opening in the housing half 56 in a roll angle adjustment process step which is indicated by the arrows, as shown in FIG. 1, the motherboard 54 being fixed, for example clamped, stuck or screwed, on or in the housing half 56. The housing half 56 comprises features to allow it to be clearly oriented in the vehicle. The purpose of the roll angle adjustment step is to attain as small as possible a variation of the roll angle of the image sensor 52' of the optical module 58 from the vehicle features. Following the roll angle adjustment, the optical module 58 is fixed in the housing half 56 by means of a permanent joining method, for example by adhesion. The roll angle can also be adjusted prior to the ACFA bonding.

As a result of the roll angle adjustment, the connections of the connecting regions 14 and 16 of the flexible conductor track 10 are loaded relatively highly due to the forces occurring. Said loads are reduced by the flexible conductor track 10 according to the invention as explained below. After completing the roll angle adjustment, the housing is closed by joining the housing halves 56 and 56' together, for example by joining the smaller housing half 56' and the upper housing half 56 together by snap connections or by bonding or screwing both housing halves 56 and 56' to one another.

According to an exemplary embodiment, the flexible conductor track 10 preferably comprises a laminated construction of various plastics including adhesives and metals, in order to be able to withstand the loads of the roll angle adjustment (this applies in both cases, since a torsional/bending resistance moment is applied over the flexible conductor track in each case: final mounting with ACFA bonding prior to roll angle adjustment or following roll angle adjustment). For example, the flexible conductor track can comprise a middle 25 μm thick base layer made of a PI plastic, on the upper side of which a first 12.5 μm thick copper layer is applied and on the lower side of which a second 12.5 μm thick copper layer is applied. The first copper layer is coated by a first 12.5 μm thick PI plastic layer fastened by means of a 15 μm thick adhesive layer. Accordingly, the second copper layer is coated by a second 12.5 μm thick PI plastic layer fastened by means of a 15 μm thick adhesive layer. All in all, this results in a loadable 105 μm thick flexible conductor track.

The flexible conductor track should be configured with the available degrees of freedom such that its self-resonance lies, if at all possible, outside the oscillations occurring in a vehicle deployment, in order to avoid loads occurring due to the self-resonance induced by oscillations.

Figure 3:
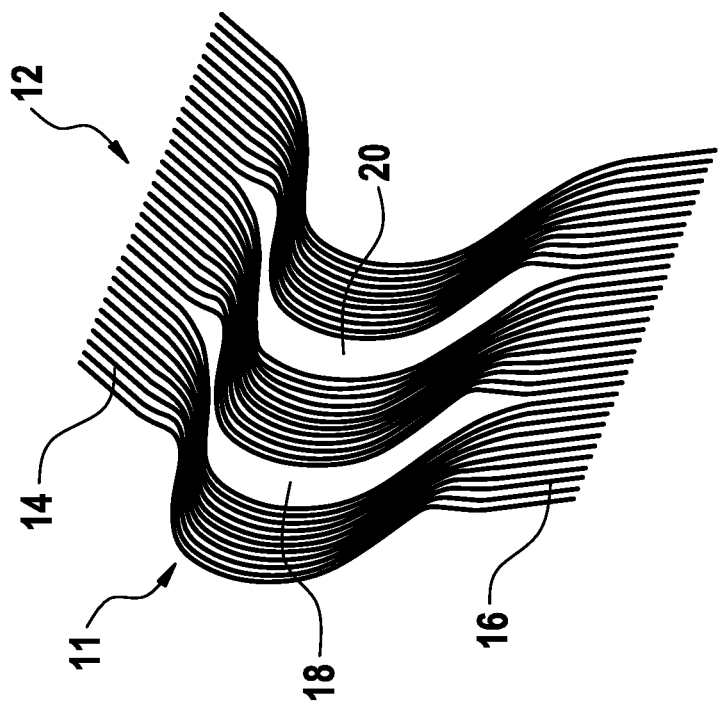
FIG. 3 shows the substrate and conductor track structures of an exemplary embodiment of a flexible conductor track according to the invention in the bent condition.
Figure 3:
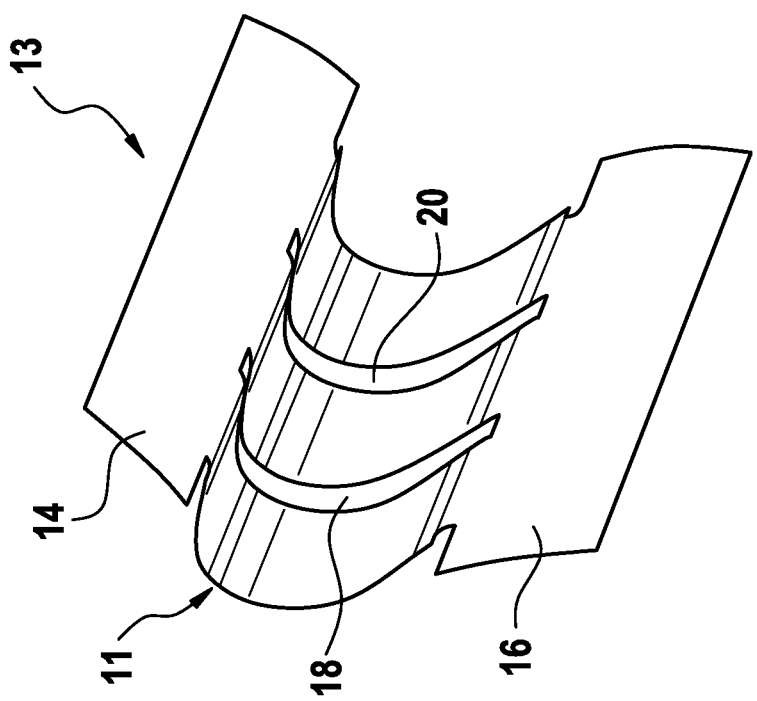

In order to further increase the load-carrying capacity and to reduce the torsional/bending resistance moment of the flexible conductor track 10 particularly during the roll angle adjustment, one or more long slits 18, 20 can be introduced in a region 11 located between the connecting regions 14 and 16. The slits 18, 20 are introduced between the conductor track structures 12, or respectively the conductor track structures 12 are designed such that the individual track structures run around the slits. A carrier substrate 13 and the conductor track structures 12 of a flexible conductor track having two long slits 18 and 20 running parallel in a region 11 between the connecting regions 14 and 16 are shown in FIG. 3. The long slits 18 and 20 are cut-outs from the carrier substrate 13 and the conductor track structures 12 are designed such that they run around these cut-outs 18 and 20 or respectively the cut-outs 18 and 20 are located in regions which are left free by conductor track structures 12. The longitudinal cut-outs 18 and 20 end before the connecting regions 14 and 16, in order to obtain as flat as possible a configuration for the ACFA bonding at one end and the adhesive bonding of the image sensor at the other end. Thanks to the slits 18, 20 in the flexible conductor track, forces due to the roll angle adjustment and other mounting processes (bending, displacement) can be accommodated by the flexible conductor track changing shape. As can be seen in FIG. 3, the conductor track structures 12 run closer together in the cutout regions of the slits 18, 20, i.e. at a smaller distance, whereas they are again configured at a greater distance in the end regions.

Figure 4:
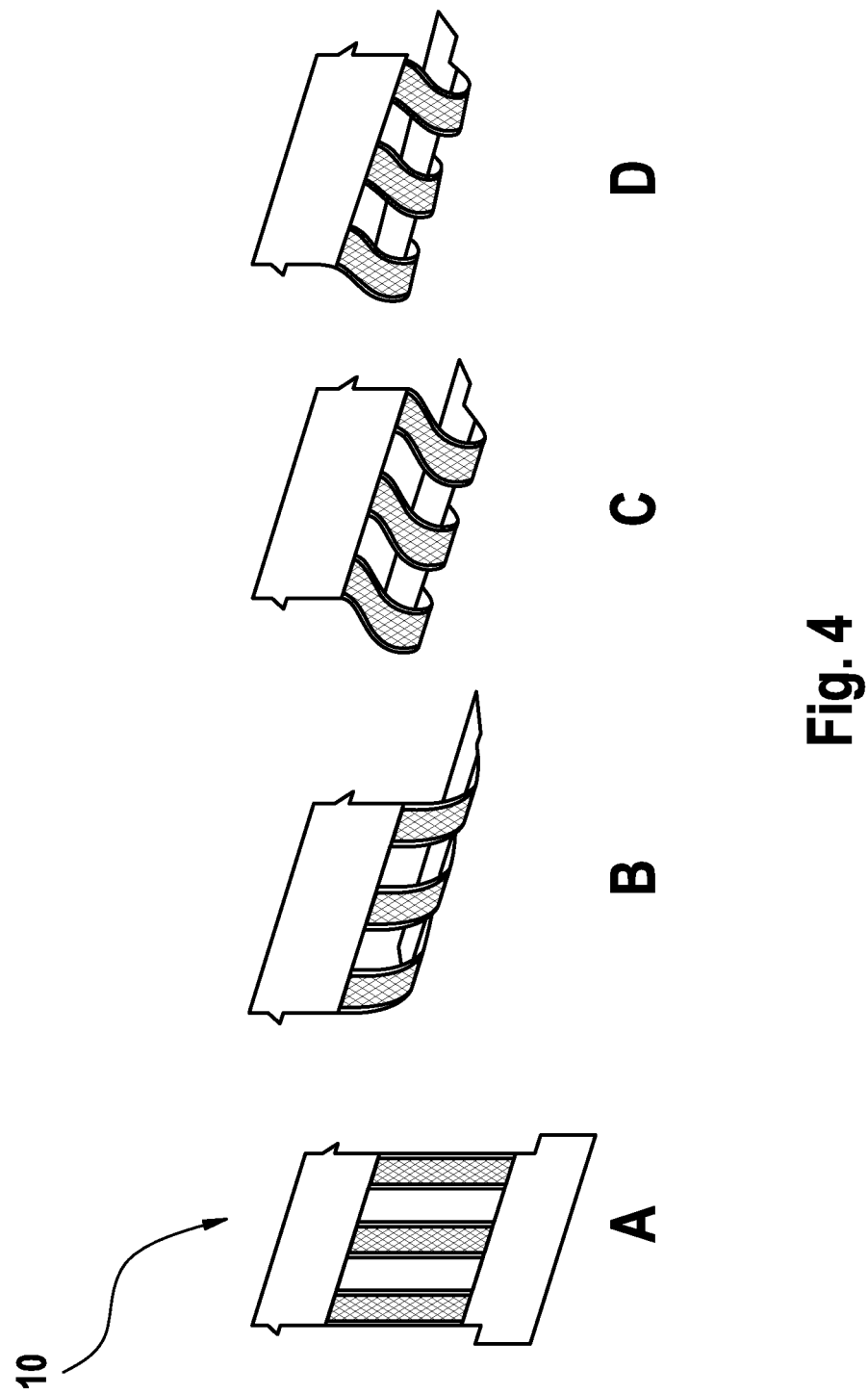
FIG. 4 shows various conditions of the flexible conductor track during the mounting of the camera shown in FIGS. 1 and 2.

FIG. 4 shows the bending conditions of the flexible conductor track 10 during the mounting of the camera shown in FIGS. 1 and 2. The initial position is shown in A, a bending for mounting a connecting region of the conductor track 10 on the motherboard is shown in B, the bending which occurs in the housing during movement of the motherboard is shown in C, and the bending which occurs during the roll angle adjustment is shown in D.

Figure 5:
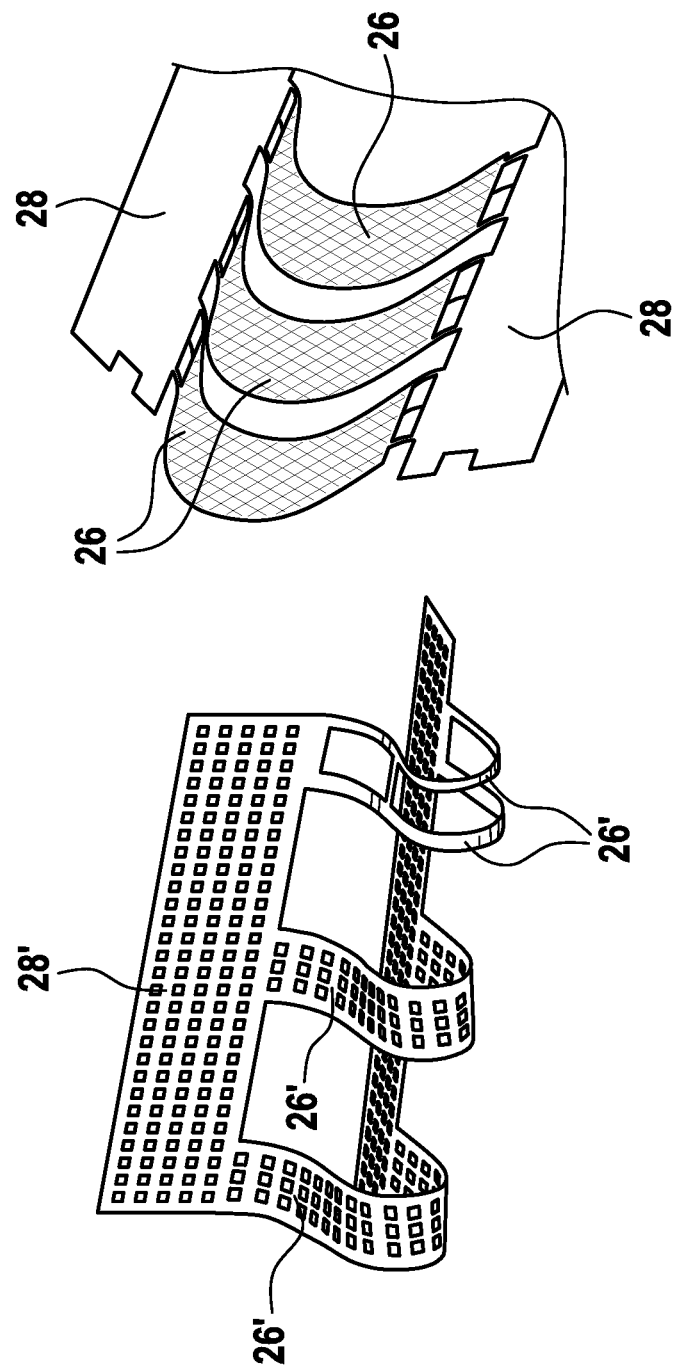
FIG. 5 shows two exemplary embodiments of reinforcing layers of a flexible conductor track according to the invention.

The load-carrying capacity of the flexible conductor track can be further optimized if the flexible conductor track is provided with an additional reinforcing layer. The additional reinforcing layer can be designed, for example, in the form of a second metal layer (e.g. copper) which is not used for conductor tracks, but is configured in such a manner that the flexible conductor track withstands extreme deformations, particularly bending and the forces which act during the roll angle adjustment. To this end, line grids, dot patterns and/or cross grids can be configured in the second metal layer. Said structures make possible an additional protective function during bending as well as a holding force in order to hold the deformation in the product. FIG. 5 shows two different configurations of such a second metal layer made of copper for increasing the load-carrying capacity. In the configuration shown on the right in FIG. 5, the second copper layer is configured such that it covers the full surface in the connecting region 28 and the slots are not drawn through, in order to make possible as sturdy and flat as possible a configuration of the regions for the ACFA bonding and the adhesive bonding of the image sensor. In the region 26 of the slots, the second copper layer is configured in the form of a cross grid. In the configuration shown on the left in FIG. 5, the second copper layer is configured consistently as a dot pattern, that is to say both in the connecting region 28' and in the region 26' of the slots. In this configuration, the slots additionally have a very wide configuration, in order to guarantee as good a load-carrying capacity as possible during the corresponding roll angle adjustment.

Figure 6:
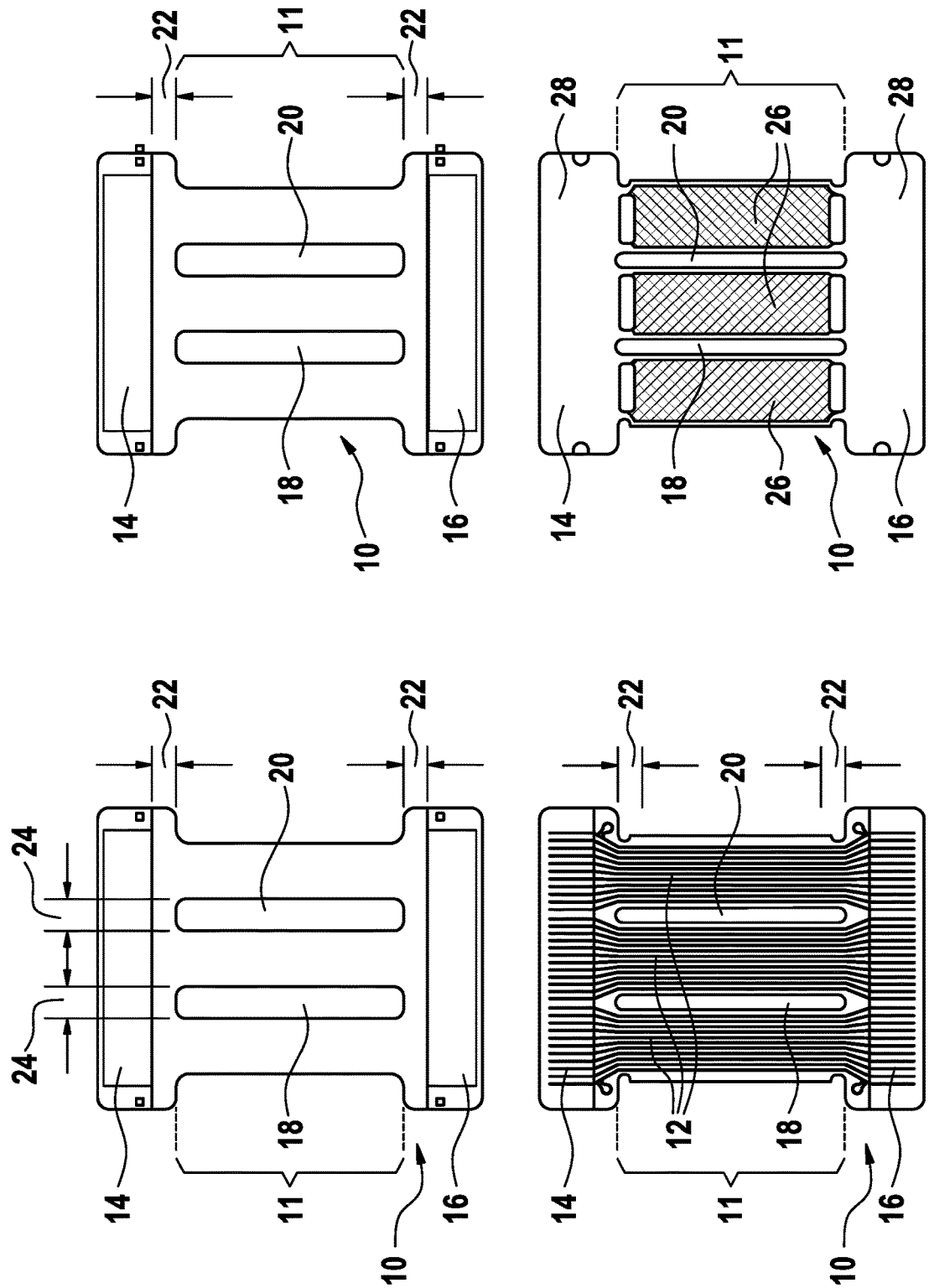
FIG. 6 shows four views of an exemplary embodiment of a flexible conductor track according to the invention.

FIG. 6 shows four views of an exemplary embodiment of the flexible conductor track 10 according to the invention, in which further details of the possible configuration of the conductor track 10 are represented. In the case of the conductor track 10 shown, the two long slits 18 and 20 end at a distance 20 before the connecting regions 14 and 16 provided for an ACFA bonding, as a result of which it is possible to ensure that the support for the connecting regions 14, 16 is as flat as possible for the bonding. The width 24 of the long slits 18 and 20 additionally decreases towards the connecting regions 14, 16 such that the support surface for the ACFA bonding can be enlarged and, thus, the load-carrying capacity of the bonding connection can be increased. In the illustration at the bottom left in FIG. 6, the conductor track structures 12 and their course can be seen, particularly how the distances of the individual structures become larger in the connecting regions 14 and 16 in contrast to the distances in region 11. The illustration at the bottom right in FIG. 6 shows an additional reinforcing layer 26, 28 of the conductor track 10, which is designed to cover the full surface in the connecting regions 14 and 16 (region 28) and is designed in the form of a cross grid (region 26) in the region 11 of the long slits 18, 20.

Figure 7:
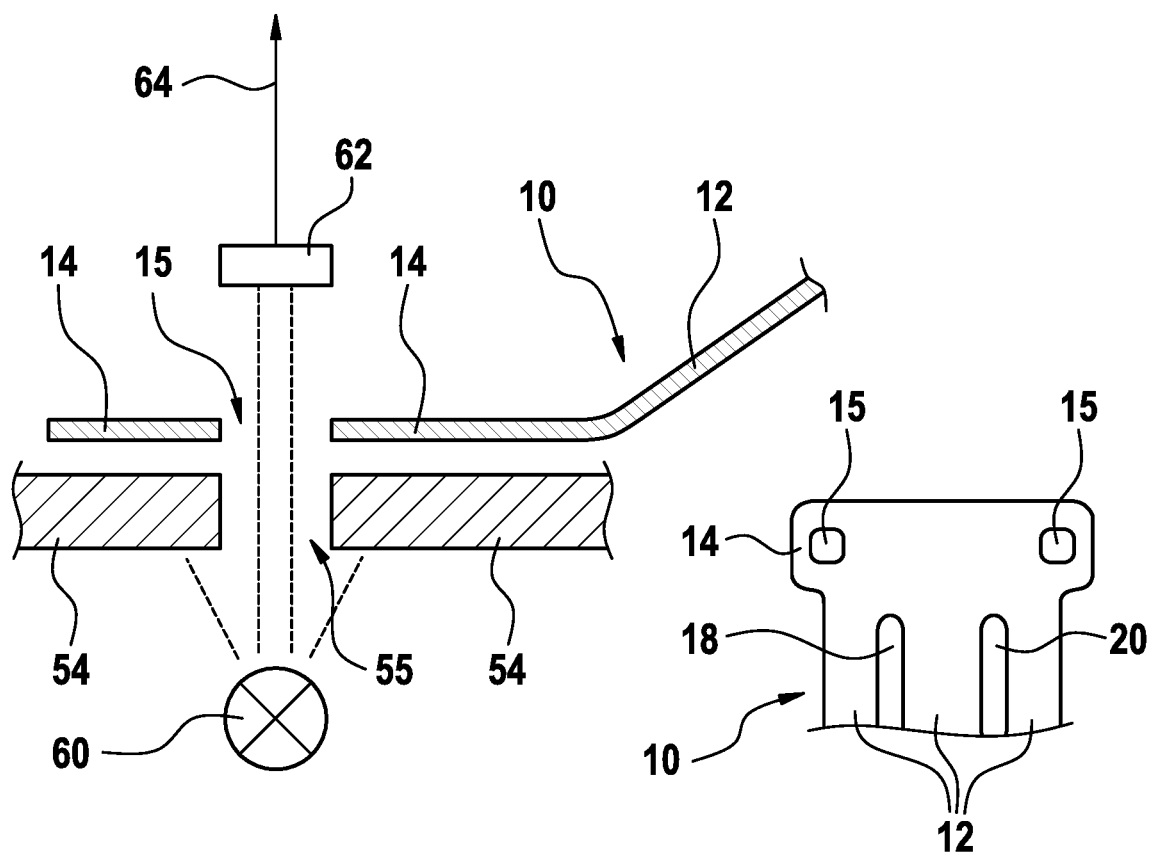
FIG. 7 shows an alignment method during the mounting of the flexible conductor track according to the invention.

FIG. 7 shows an alignment method during the mounting of the flexible conductor track 10 according to the invention, in which through-bores 55 of a printed circuit board 54 (so-called VIAs; these are deployed during the standard manufacturing process in printed circuit board manufacture) are used in order to make possible a reproducible position control, for alignment purposes in the alignment process, for the ACFA bonding between a connecting region 14 of the flexible conductor track 10 and a motherboard 54 by backlighting by means of a lamp 60 and a punching 15 in the connecting region 14 of the flexible conductor track 10. The punching 15 forms an inspection window in the connecting region 14 or respectively a transparent window for at least part of the wavelengths of the backlighting of the lamp 60. A light sensor 62 arranged opposite the lamp 60 on the other side of the connecting region 14 in the region of the inspection window 15 produces a sensor signal 64 which represents the intensity of the radiation captured and entering through the through-bore 55 and the inspection window 15. The sensor signal 64 can then be further used to align the connecting region 14 by determining a maximum value of the sensor signal 64, for example, at which the inspection window 15 is arranged precisely above the through-bore 55, such that the maximum quantity of radiation from the lamp 60 can hit the sensor 62. A top view of an exemplary embodiment of the flexible conductor track 10 having inspection windows 15 in the connecting region 14 is shown on the right at the bottom in FIG. 7.

The invention claimed is:

1. A flexible conductor track for connecting first and second electronic modules, wherein the second electronic module includes a circuit board, and wherein the flexible conductor track comprises:
    conductor track structures,
    first and second connecting regions configured to electrically connect the conductor track structures to corresponding conductor tracks of the first and second electronic modules, wherein the conductor track structures extend from the first connecting region to the second connecting region,
    at least one long slit disposed in a region in the flexible conductor track located between the first and second connecting regions, and
    an optical alignment inspection window disposed in the second connecting region,
    wherein the second connecting region is configured to be connected to a connecting area of the second electronic module by anisotropic conductive film adhesive bonding, and
    wherein the optical alignment inspection window is configured and located to cooperate and align with a via of the circuit board of the second electronic module to optically align the second connecting region with the connecting area of the second electronic module.

2. The flexible conductor track according to claim 1, wherein a long slit among the at least one long slit ends at a predetermined distance before the connecting regions.

3. The flexible conductor track according to claim 1, wherein a long slit among the at least one long slit has a width that decreases toward at least one of the connecting regions.

4. The flexible conductor track according to claim 1, wherein neighboring ones of the conductor track structures are arranged with spacing distances therebetween, which spacing distances are smaller in a region of the at least one long slit than in at least one of the connecting regions.

5. The flexible conductor track according to claim 1, having a laminated construction of multiple layers made of plastics, adhesives and metals, including a first covering plastic layer, a first adhesive layer, a first copper layer, a middle plastic layer, a second copper layer, a second adhesive layer and a second covering plastic layer.

6. The flexible conductor track according to claim 1, further comprising an additional reinforcing layer configured to counteract bending forces acting on the flexible conductor track.

7. The flexible conductor track according to claim 6, wherein the additional reinforcing layer is configured as a line grid, a dot pattern or a cross grid applied extensively to the flexible conductor track.

8. The flexible conductor track according to claim 6, wherein the additional reinforcing layer covers an entire surface of at least one of the connecting regions.

9. The flexible conductor track according to claim 1, wherein at least one of the connecting regions is wider than a region of the flexible conductor track comprising the at least one long slit.

10. An optical module for a camera configured to be installed in a vehicle,
    the optical module comprising an image sensor module, a lens, and the flexible conductor track according to claim 1,
    wherein the image sensor module is the first electronic module and comprises an image sensor and a backplate, wherein the image sensor is arranged on the first connecting region of the flexible conductor track, and is connected to the conductor track structures by anisotropic conductive film adhesive bonding, and wherein the backplate supports the first connecting region and the image sensor thereon, and
    wherein the lens is fastened to the first connecting region of the flexible conductor track by adhesive so that the lens can produce optical imaging on the image sensor.

11. The flexible conductor track according to claim 1, wherein the conductor track structures have widths that are smaller in a region of the at least one long slit than in at least one of the connecting regions.

12. A combination comprising the flexible conductor track according to claim 1, the second electronic module, a lamp and a light sensor, wherein the lamp and the light sensor are arranged opposite one another, with the via of the circuit board and the optical alignment inspection window of the second connecting region of the flexible conductor track aligned with one another between the lamp and the light sensor, wherein the lamp is configured to emit light through the via and the optical alignment inspection window onto the light sensor, and wherein the light sensor is configured to output a signal that represents an intensity of the light impinging on the sensor and thereby indicates an extent of an optical alignment of the optical alignment inspection window and the via.

13. An electronic arrangement comprising an electronic module, a flexible conductor track and an anisotropic conductive film adhesive, wherein:
    the flexible conductor track comprises a first connecting region, a second connecting region, and plural longitudinally extending conductor track structures that each longitudinally extend from the first connecting region to the second connecting region and that each mechanically and electrically connect the first connecting region with the second connecting region;

the conductor track structures are laterally spaced apart from one another, and a respective elongated longitudinally extending open slit is bounded between respective neighboring ones of the conductor track structures and extends longitudinally between the first connecting region and the second connecting region;

the anisotropic conductive film adhesive bonds a connecting area of the electronic module to the second connecting region of the flexible conductor track;

the electronic module includes a circuit board that has a via therein; and the second connecting region has an optical alignment inspection window aligned with the via to optically align the second connecting region of the flexible conductor track with the connecting area of the electronic module.

14. The electronic arrangement according to claim 13, wherein the conductor track structures and the connecting regions comprise individual conductor traces that each extend continuously along the first connecting region, a respective one of the conductor track structures, and the second connecting region, and wherein the conductor traces are laterally closer to one another in the conductor track structures and laterally farther apart from one another in the first and second connecting regions.

15. The electronic arrangement according to claim 13, wherein the flexible conductor track is configured to have a self-resonance frequency different from a frequency of oscillations that occur in a deployment of the electronic arrangement in a vehicle.

16. The electronic arrangement according to claim 13, wherein the alignment inspection window is an open through-hole passing through a thickness of the second connecting region.

17. The electronic arrangement according to claim 13, further comprising a lamp and a light sensor arranged opposite one another, with the via of the circuit board and the optical alignment inspection window of the second connecting region of the flexible conductor track aligned with one another between the lamp and the light sensor, wherein the lamp is configured to emit light through the via and the optical alignment inspection window onto the light sensor, and wherein the light sensor is configured to output a signal that represents an intensity of the light impinging on the sensor and thereby indicates an extent of an optical alignment of the optical alignment inspection window and the via.

* * * * *